United States Patent
McGaughy et al.

(10) Patent No.: US 9,804,894 B2
(45) Date of Patent: Oct. 31, 2017

(54) DYNAMIC LOAD BALANCING IN CIRCUIT SIMULATION

(71) Applicant: PROPLUS ELECTRONICS CO., LTD., Jinan (CN)

(72) Inventors: Bruce W. McGaughy, Pleasanton, CA (US); Zhaozhi Yang, Beijing (CN)

(73) Assignee: PROPLUS DESIGN SOLUTIONS, INC., San Jose, CA (US)

( * ) Notice: Subject to any disclaimer, the term of this patent is extended or adjusted under 35 U.S.C. 154(b) by 415 days.

(21) Appl. No.: 14/219,429

(22) Filed: Mar. 19, 2014

(65) Prior Publication Data
US 2014/0310722 A1    Oct. 16, 2014

(30) Foreign Application Priority Data
Apr. 16, 2013    (CN) .......................... 2013 1 0131869

(51) Int. Cl.
*G06F 9/50* (2006.01)
*G06F 17/50* (2006.01)

(52) U.S. Cl.
CPC ........ *G06F 9/5066* (2013.01); *G06F 17/5009* (2013.01)

(58) Field of Classification Search
None
See application file for complete search history.

(56) References Cited

U.S. PATENT DOCUMENTS

| | | | | |
|---|---|---|---|---|
| 5,768,500 A * | 6/1998 | Agrawal | ............... | G06F 11/348 714/47.2 |
| 8,973,010 B2 * | 3/2015 | Haas | ..................... | G06F 9/5066 718/105 |
| 2006/0136849 A1 * | 6/2006 | Greenberg | .......... | G06F 17/5022 716/106 |
| 2010/0251257 A1 * | 9/2010 | Kim | ..................... | G06F 9/5027 718/105 |

* cited by examiner

*Primary Examiner* — Eric C Wai
(74) *Attorney, Agent, or Firm* — Silicon Valley Patent Group LLP; Thomas C. Chan

(57) ABSTRACT

Methods and systems are disclosed related to dynamic load balancing in circuit simulation. In one embodiment, a computer implemented method of performing dynamic load balancing in simulating a circuit includes identifying a plurality of simulation tasks to be performed, determining estimated processing durations corresponding to performance of the plurality of simulation tasks, distributing the plurality of simulation tasks to a plurality of processors according to the estimated processing duration of each simulation task, and performing the plurality of simulation tasks at the plurality of processors in parallel.

17 Claims, 7 Drawing Sheets

DYNAMIC LOAD BALANCING IN CIRCUIT SIMULATION

CROSS-REFERENCE TO PRIORITY APPLICATION FILED IN CHINA

This patent application claims priority from Chinese Application No. 201310131869.5 filed in The State Intellectual Property Office of the People's Republic of China on Apr. 16, 2013, which is incorporated by reference herein in its entirety.

FIELD

The present invention relates to the field of electronic design automation tools. In particular, the present invention relates to dynamic load balancing in circuit simulation.

BACKGROUND

An integrated circuit is a network of circuit elements such as resistors, capacitors, inductors, mutual inductors, transmission lines, diodes, bipolar junction transistors (BJT), junction field effect transistors (JFET), metal-oxide-semiconductor field effect transistors (MOSFET), metal-semiconductor field effect transistors (MESFET), thin-film transistors (TFT), etc.

The development of complicated integrated circuits often requires the use of powerful numerical simulation programs. For example, circuit simulation is an essential part in the design flow of integrated circuits, helping circuit designers to verify the functionality and performance of their designs without going through expensive fabrication processes. As the semiconductor processing technology migrates to nanometer dimensions, new simulation methodologies are needed to solve the new problems intrinsically existing in circuit design with nanometer features. Modern integrated circuits continually challenge circuit simulation algorithms and implementations in the development of new technology generations. The semiconductor industry requires EDA software with the ability to analyze nanometer effects like coupling noise, ground bounce, transmission line wave propagation, dynamic leakage current, supply voltage drop, and nonlinear device and circuit behavior, which are all related to dynamic current. Thus, detailed circuit simulation and transistor-level simulation have become one of the most effective ways to investigate and resolve issues with nanometer designs.

Examples of electronic circuit simulators include the Simulation Program with Integrated Circuit Emphasis (SPICE) developed at the University of California, Berkeley (UC Berkeley), and various enhanced versions or derivatives of SPICE. SPICE and its derivatives or enhanced versions will be referred to hereafter as SPICE circuit simulators, or SPICE. The SPICE method considers a circuit as a non-divided object.

SPICE-like simulations may provide fairly accurate predictions of how corresponding circuits will behave when actually built. The predictions are preferably made not only for individual sub-circuit but also for whole systems (e.g., whole integrated circuits) so that system-wide problems relating to noise and the like may be uncovered and dealt with. In a general process flow of a SPICE-like simulation, an analog integrated circuit under simulation is often represented in the form of a netlist description. A netlist is a circuit description of the analog circuit to be simulated written in a SPICE-like language. SPICE netlists are pure structural languages with simulation control statements. Other language like Verilog-A™ has the capability to include behavioral constructs. The structural netlist of SPICE together with a predefined set of circuit components of the analog integrated circuit may be represented in the form of a matrix in accordance with certain circuit modeling methodologies (which is not a concern of the present disclosure). The number of non-linear differential equations ranges from 1 to n. There are a corresponding number of input vectors to be operated by the linear equation. The set of input vectors are shown as $\{I_1, I_2, \ldots I_n\}$. Next, the linear matrix is computed with the set of input vectors to generate a set of solution vectors $\{V_1, V_2, \ldots V_n\}$. The computation is repeated until the set of solutions converge. The set of solutions may be then displayed in the form of waveforms, measurements, or checks on a computer screen for engineers to inspect the simulation results.

However, SPICE-like simulation of a whole system becomes more difficult and problematic as the industry continues its relentless trek of scaling down to smaller and smaller device geometries and of cramming more interconnected components into the system. An example of such down scaling is the recent shift from micron-sized channels toward deep submicron sized transistor channel lengths. Because of the smaller device geometries, a circuit designer are able to cram exponentially larger numbers of circuit components (e.g., transistors, diodes, capacitors) into a given integrated circuit (IC), and therefore increases the matrix size to a complexity which may not be solved in a desired time frame.

A circuit may be represented as a large numerically discrete nonlinear matrix for analyzing instant current. The matrix dimension is of the same order as the number of the nodes in the circuit. For transient analysis, this giant nonlinear system needs to solve hundreds of thousand times, thus restricting the capacity and performance of the SPICE method. The SPICE method in general can simulate a circuit up to about 50,000 nodes. Therefore it is not practical to use the SPICE method in full chip design. It is widely used in cell design, library building, and accuracy verification.

With some accuracy lost, the Fast SPICE method developed in the early 1990s provides capacity and speed about two orders of magnitude greater than the SPICE method. The performance gain was made by employing simplified models, circuit partition methods, and event-driven algorithms, and by taking advantage of circuit latency.

SPICE models a circuit in a node/element fashion, i.e., the circuit is regarded as a collection of various circuit elements connected at nodes. At the heart of SPICE is the so-called Nodal Analysis, which is accomplished by formulating nodal equations (or circuit equations) in matrix format to represent the circuit and by solving these nodal equations. The circuit elements are modeled by device models, which produce model results that are represented in the circuit equations as matrices.

A device model for modeling a circuit element, such as the SPICE model for modeling MOSFET devices, developed by UC Berkeley, typically includes model equations and a set of model parameters that mathematically represent characteristics of the circuit element under various bias conditions. For example, a circuit element with n terminals can be modeled by the following current-voltage relations:

$$I_i = f_i(V_1, \ldots, V_n, t) \text{ for } i=1, \ldots, n,$$

where $I_i$ represents the current entering terminal I; $V_j$ (j=1, ..., n) represents the voltage or terminal bias across terminal j and a reference terminal, such as the ground; and t represents the time. The Kirchhoff's Current Law implies that the current entering terminal n is given by $$I_n = \sum_{i=1}^{n-1} I_i.$$

A conductance matrix of the circuit element is defined by:

$$G(V_1, \ldots, V_n, t) := \begin{pmatrix} \frac{\partial f_1}{\partial V_1} & \cdots & \frac{\partial f_1}{\partial V_n} \\ \vdots & \ddots & \vdots \\ \frac{\partial f_n}{\partial V_1} & \cdots & \frac{\partial f_n}{\partial V_n} \end{pmatrix}.$$

To model the circuit element under alternating current (AC) operations, the device model also considers the relationship between node charges and the terminal biases:

$Q_i = q_i(V_1, \ldots, V_n, t)$ for $i = 1, \ldots, n$.

where $Q_i$ represents the node charge at terminal i. Thus, the capacitance matrix of the n-terminal circuit element is defined by $$C(V_1, \ldots, V_n, t) := \begin{pmatrix} \frac{\partial q_1}{\partial V_1} & \cdots & \frac{\partial q_1}{\partial V_n} \\ \vdots & \ddots & \vdots \\ \frac{\partial q_n}{\partial V_1} & \cdots & \frac{\partial q_n}{\partial V_n} \end{pmatrix}.$$

In simulating circuits represented in a hierarchical data structure, it is desirable to have processing of instances in a level finished before the method may process instances in a higher level. Each instance may be represented as a block matrix, which can be a part of a larger matrix. Thus, it is desirable to finish computation of blocks in one level before the method may move up the hierarchy to start processing of blocks representing higher level instances. In conventional circuit simulation solutions, it is observed that some processors may have to wait for other processors to finish processing tasks of instances in a same hierarchical level before they can process other tasks in a higher level.

Therefore, there is a need for methods and systems that address the issues of the conventional simulation systems described above. Specifically, there is a need for methods and systems that can perform dynamic load balancing in circuit simulation.

SUMMARY

Method and system are disclosed for performing dynamic load balancing in simulating a circuit. In one embodiment, a computer implemented method of performing dynamic load balancing in simulating a circuit includes identifying a plurality of simulation tasks to be performed, determining estimated processing durations corresponding to performance of the plurality of simulation tasks, distributing the plurality of simulation tasks to a plurality of processors according to the estimated processing duration of each simulation task, and performing the plurality of simulation tasks at the plurality of processors in parallel.

In another embodiment, an apparatus for performing dynamic load balancing in simulating a circuit comprising one or more processors and a dynamic load balancing module controlled by the one or more processors. The dynamic load balancing module comprises logic configured to identify a plurality of simulation tasks to be performed, logic configured to determine estimated processing durations corresponding to performance of the plurality of simulation tasks, logic configured to distribute the plurality of simulation tasks to a plurality of processors according to the estimated processing duration of each simulation task, and logic configured to perform the plurality of simulation tasks at the plurality of processors in parallel.

In yet another embodiment, a system for performing dynamic load balancing in simulating a circuit comprises at least a processor and a dynamic load balancing module configured to work with the at least one processor. The dynamic load balancing module includes logic configured to identify a plurality of simulation tasks to be performed, logic configured to determine estimated processing durations corresponding to performance of the plurality of simulation tasks, logic configured to distribute the plurality of simulation tasks to a plurality of processors according to the estimated processing duration of each simulation task, and logic configured to perform the plurality of simulation tasks at the plurality of processors in parallel.

BRIEF DESCRIPTION OF THE DRAWINGS

The aforementioned features and advantages of the invention, as well as additional features and advantages thereof, will be more clearly understandable after reading detailed descriptions of embodiments of the invention in conjunction with the following drawings.

DESCRIPTION OF EMBODIMENTS

Methods and systems are disclosed related to dynamic load balancing in circuit simulation. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Some portions of the detailed description that follows are presented in terms of flowcharts, logic blocks, and other symbolic representations of operations on information that can be performed on a computer system. A procedure, computer-executed step, logic block, process, etc., is here conceived to be a self-consistent sequence of one or more steps or instructions leading to a desired result. The steps are those utilizing physical manipulations of physical quantities. These quantities can take the form of electrical, magnetic, or radio signals capable of being stored, transferred, combined, compared, and otherwise manipulated in a computer system. These signals may be referred to at times as bits, values, elements, symbols, characters, terms, numbers, or the like. Each step may be performed by hardware, software, firmware, or combinations thereof.

Figure 1:
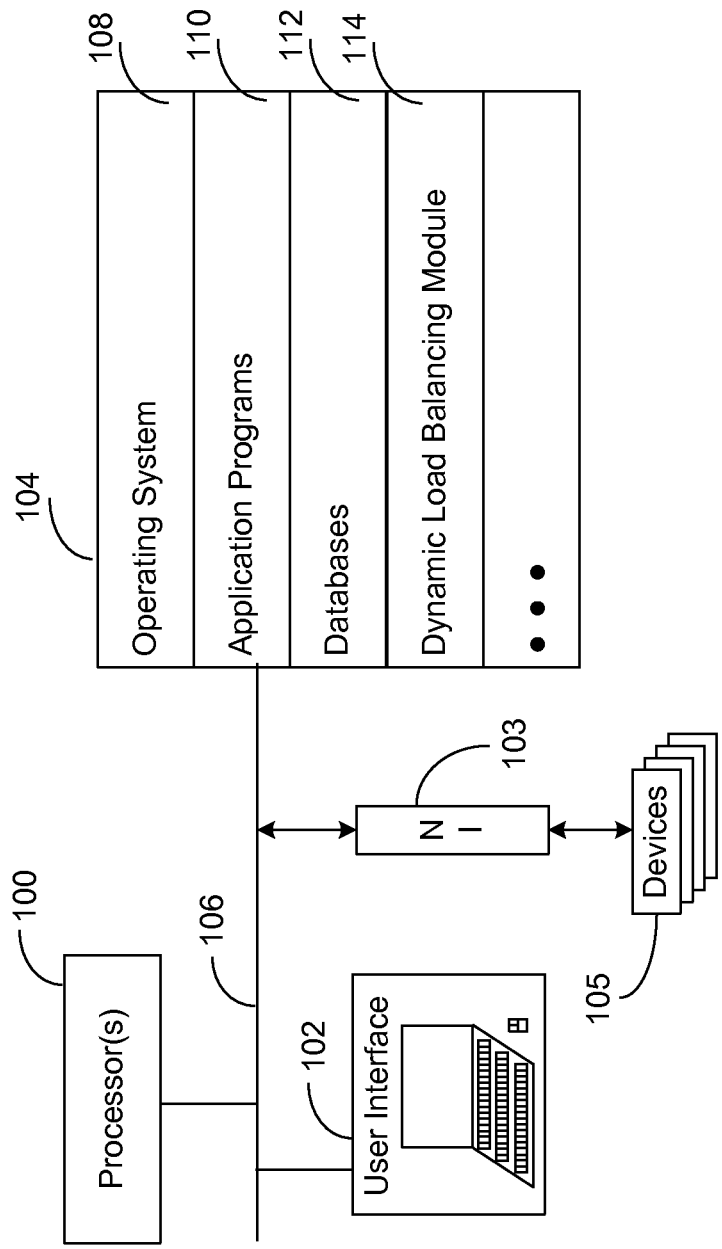
FIG. 1 illustrates a system for implementing methods of dynamic load balancing in circuit simulation according to some aspects of the present disclosure.

FIG. 1 illustrates a system for implementing methods of repetitive circuit simulation according to an embodiment of the present disclosure. In one embodiment, the methods for conducting repetitive circuit simulation may be implemented using a computer system. The computer system may include one or more graphics processing units (GPUs) and/or central processing units (CPUs) 100 (hereinafter referred to as processor(s) for short), at least a user interface 102 for displaying computation results and waveforms, a memory device 104, a system bus 106, and one or more bus interfaces for connecting the GPUs/CPUs, user interface, memory device, and system bus together. The computer system also includes at least one network interface 103 for communicating with other devices 105 on a computer network. In alternative embodiments, certain functionalities of the method and system may be implemented in one or more application-specific integrated circuits (ASICs) or field-programmable gate arrays (FPGAs), thereby reducing the role of the GPU/CPU.

The memory device 104 may include high-speed random-access memory and may also include non-volatile memory, such as one or more magnetic disk storage devices. The memory device may also include mass storage that is located remotely from the GPUs/CPUs. The memory device preferably stores:

- an operating system 108 that includes procedures for handling various basic system services and for performing hardware-dependent tasks;
- application programs 110 for performing other user-defined applications and tasks, such as circuit simulations and device evaluations;
- databases 112 for storing information of the integrated circuit, the databases include data structures, device models, and matrices;
- dynamic load balancing module 114 configured to improve efficiencies of circuit simulations.

The databases, the application programs, and the program for implementing methods of repetitive circuit simulation may include executable procedures, sub-modules, tables, and other data structures. In other embodiments, additional or different modules and data structures may be used, and some of the modules and/or data structures listed above may not be used.

Figure 2:
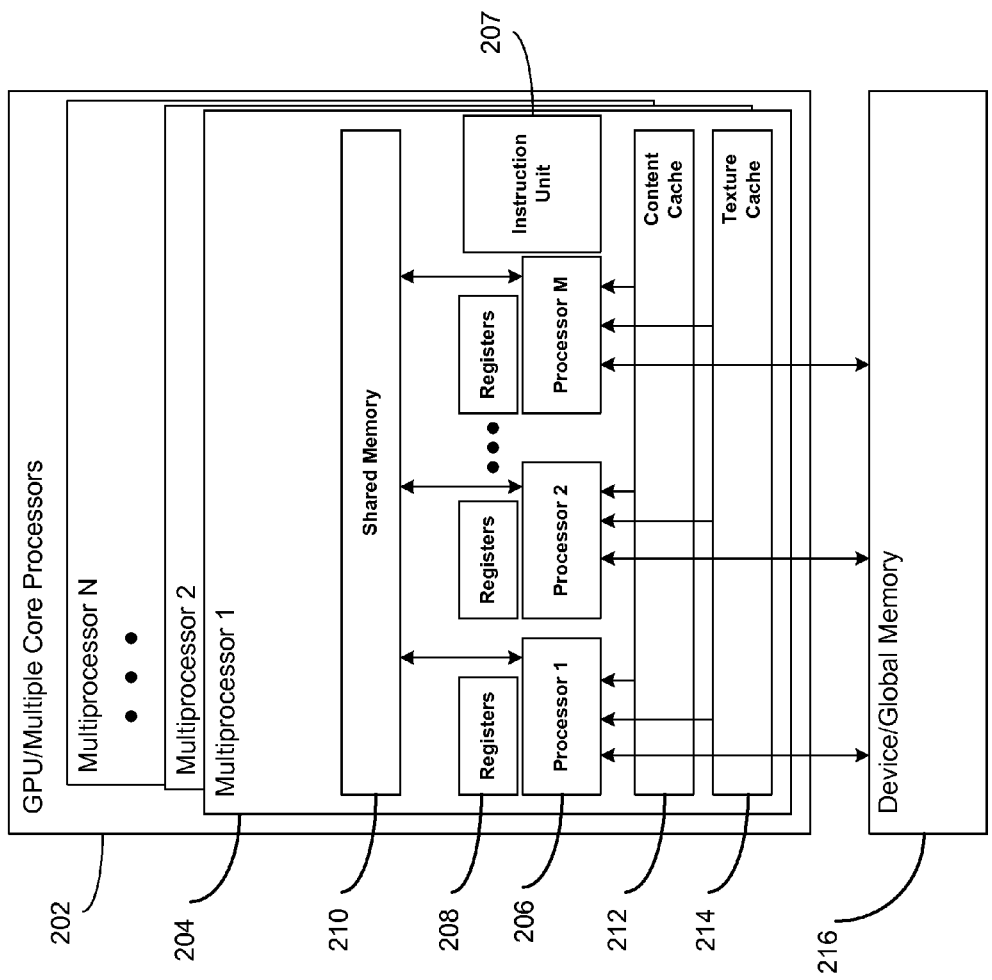
FIG. 2 illustrates an exemplary architecture of a multiple core processor unit according to some aspects of the present disclosure.

FIG. 2 illustrates an exemplary architecture of a multiple core processor (or graphics processor) unit according to some aspects of the present disclosure. As shown in FIG. 2, each GPU includes N multiprocessors. Each multiprocessor 204 further includes M processors 206 and an instruction unit 207. Each processor has its own registers 208. All the processors 206 in one multiprocessor 204 share a block of shared memory 210. All the processors share the same set of constant cache 212 and texture cache 214 memories. They can also access the data in device memory 216, which is also referred to as the global memory.

In this example, each multiprocessor 204 has a block of shared memory. Accessing data from the shared memory 210 is much faster than accessing data from the device (global) memory 216. For this reason, one approach to increase computational efficiency is to load the data from the global memory 216 to the shared memory 210, perform much of the computations/manipulations using the shared memory 210, and then write back the results from the shared memory 210 to the global memory 216.

According to aspects of the present disclosure, functions of dynamic load balancing may be performed in parallel by one or more CPUs, one or more GPUs, or by a combination of CPUs and GPUs distributed in different geographical locations (such as server farms) or located in a central location.

Figure 3:
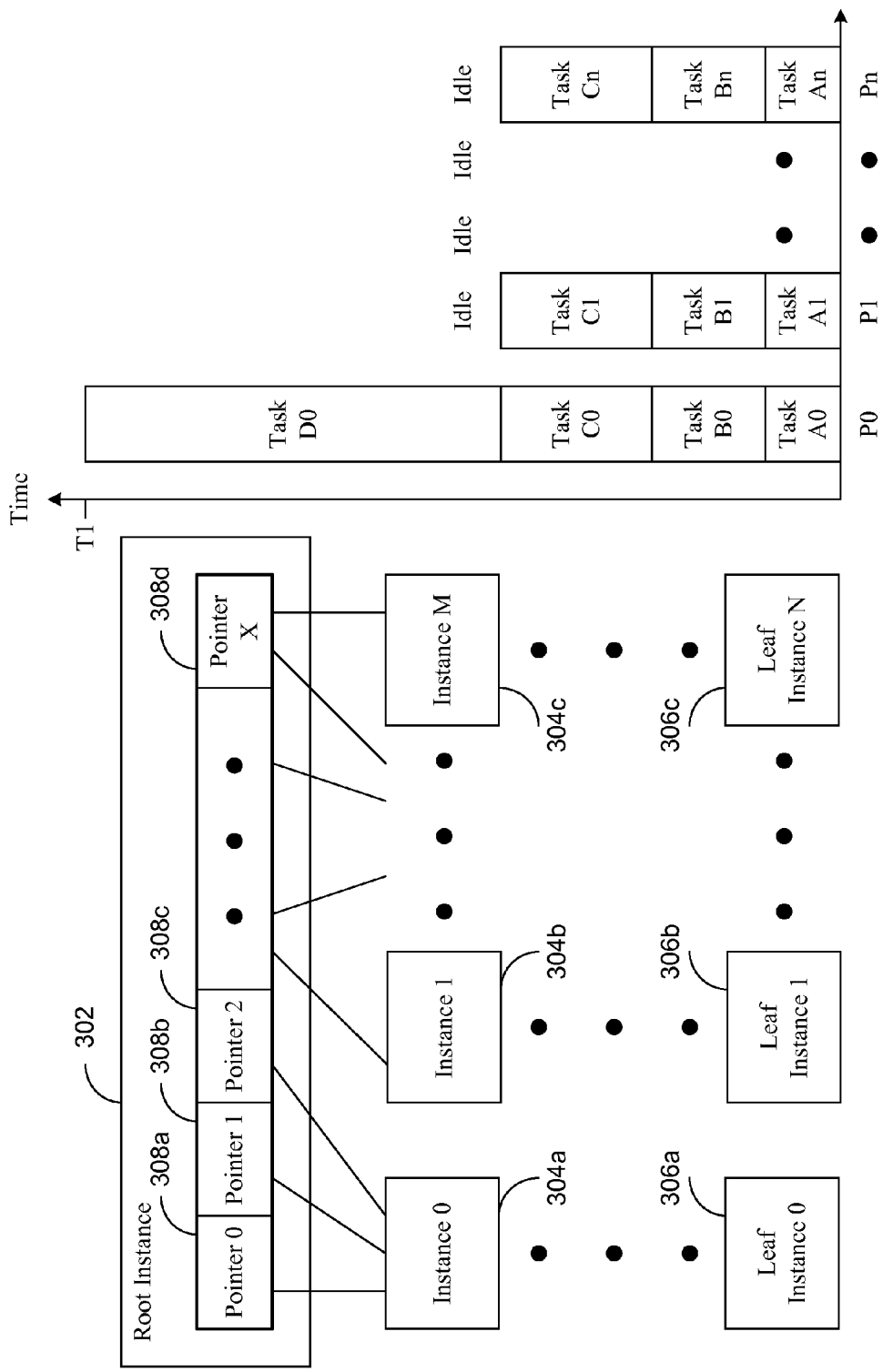
FIG. 3 illustrates a method of performing circuit simulation according to some aspects of the present disclosure.

FIG. 3 illustrates a method of performing circuit simulation according to some aspects of the present disclosure. In the example shown in FIG. 3, a circuit may be represented in a hierarchically data structure and instances of the circuit may be processed in parallel employing a plurality of processors. In one implementation, the circuit may be represented by a Root Instance 302, multiple levels of sub-instances such as Instance 0 (304a), Instance 1 (304b) and Instance M (304c), and multiple leaf instances such as Leaf Instance 0 (306a), Leaf Instance 1 (306b), and Leaf Instance N (306c). The Root Instance 302 includes an array of pointers, for example Pointer 0 (308a), Pointer 1 (308b), Pointer 2 (308c), and Pointer X (308d), that reference instances in the lower level. For example, Instance 0 (304a) may be referenced by Pointer 0 (308a), Pointer 1 (308b), and Pointer 2 (308c), and Instance M (304d) may be referenced by Pointer X (308d). Each instance may also include array of pointers (not shown) that allow the instance to reference other instances in a lower level. Note that in some implementations, the circuit may be represented in various hierarchical data structures or flatten data structures, including but not limited to top-down manner, bottom-up manner, or a combination or top-down and bottom-up manner.

Each level can have another level of hierarchy. According to some aspects of the present disclosure, it is desirable to have processing (or computation) of instances in a level finished before the method may process instances in a higher level. Each instance may represent a partition of the circuit with one or more simulation tasks, such as device model loading, device model evaluation, matrix solving, convergence checking, etc. Each instance may be represented as a block matrix, which can be a part of a larger matrix. Thus, it is desirable to finish computation of blocks in one level before the method may move up the hierarchy to start processing of blocks representing higher level instances. The right hand side of FIG. 3 illustrates an exemplary scenario in circuit simulation. In FIG. 3, multiple processors, shown as P0, P1, . . . Pn, may be assigned one or more tasks to be processed. The vertical axis represents an estimated amount of time for processing the one or more tasks. For example, P0 may be assigned to process Task A0, Task B0, Task C0 and Task D0, and the amount of time to process these four tasks may be T1. Similarly, P1 may be assigned to process Task A1, Task B1, Task C1; and Pn may be assigned to process Task An, Task Bn, and Task Cn. In this example, processors P1 to Pn have finished processing their corresponding tasks while P0 may be still processing Task D0. Processors P1 to Pn would have been idle to wait for P0 to finish processing Task D0, which can be a waste of computation resources. For the reason that some processors may have to wait for other processors to finish processing tasks of instances in a same hierarchical level, it is desirable to have a load balancing solution for simulating circuits represented in a hierarchical data structure.

Figure 4:
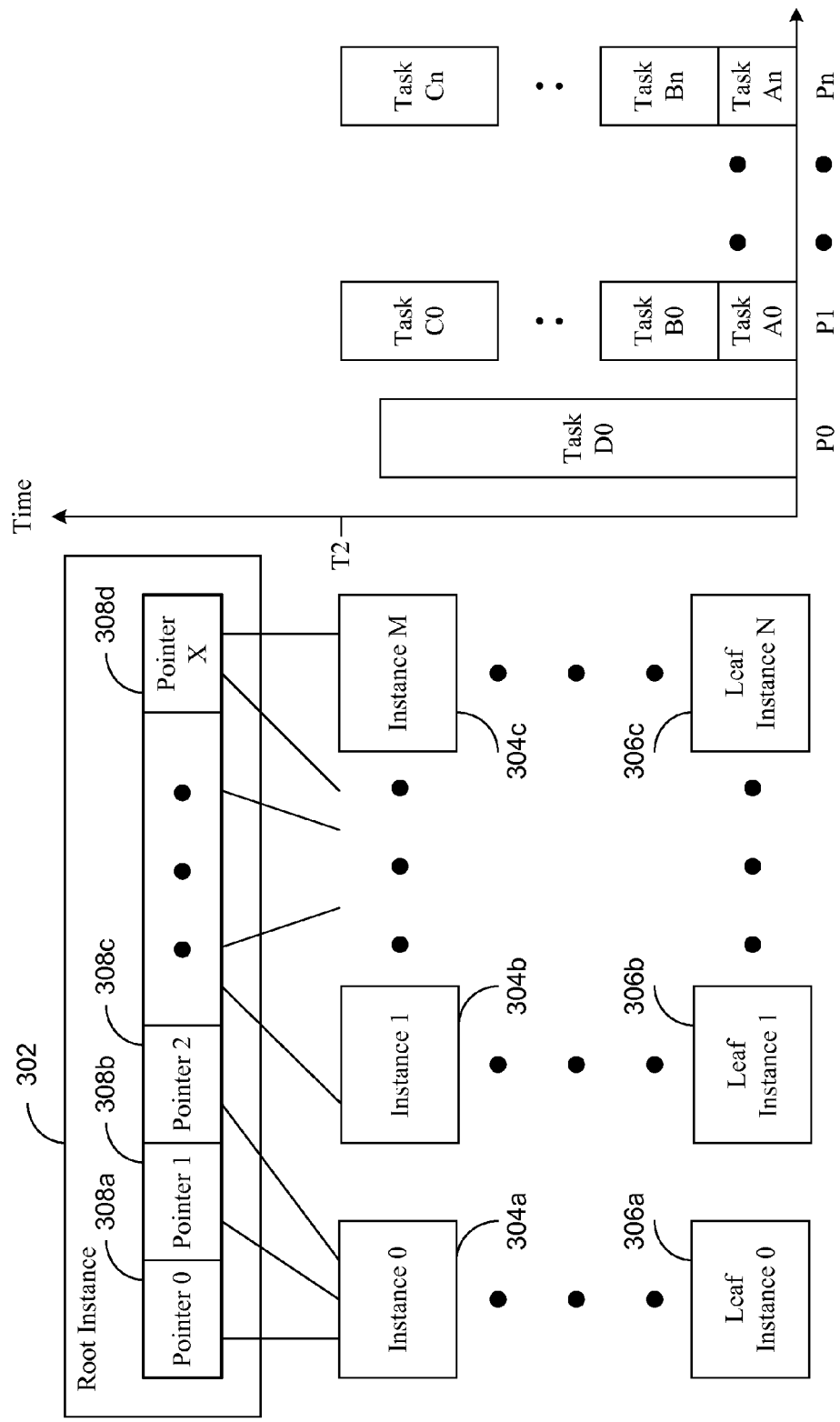
FIG. 4 illustrates a method of performing dynamic load balancing in circuit simulation according to some aspects of the present disclosure.

FIG. 4 illustrates a method of performing dynamic load balancing in circuit simulation according to some aspects of the present disclosure. Elements of the circuit shown in FIG. 4 are the same as that of FIG. 3, and their descriptions are not repeated here. In the exemplary implementation shown in FIG. 4, employing the method of dynamic load balancing, P0 may be assigned to process Task D0, P1 may be assigned to process Task A0, Task B0, Task C0, and etc.; and Pn may be assigned to process Task An, Task Bn, Task Cn, etc. In other words, the tasks are assigned to the processors according to the amount of duration (time) of processing for each task. In this example, with load balancing, all processors finished their assigned task by time T2, which is smaller than the time T1 in the example of FIG. 3. Thus, with dynamic load balancing, there can be less number of processors being idle waiting for other processors to finish processing their assigned tasks, and there can be less amount of waiting time, in this case the waiting time of P0, for the one or more processors.

Note that for simplicity of illustration, the simulation tasks in examples of FIG. 3 and FIG. 4 are labeled using alphabets such as A0, B0, C0, and D0. These tasks are associated with their corresponding instances, and the instances determine the dependencies among the tasks. The labeling of the tasks does not suggest or limit the order these tasks would be performed in simulation. According to aspects of the present disclosure, these tasks may be performed in any order based on various factors, including but not limited to: duration of the tasks, the availability of the processors, and activities of the circuit represented by the instances under simulation.

According to some aspects of the present disclosure, the method of dynamic load balancing identifies an optimal order for processing the simulation tasks. In some implementations, computation time of each instance and its corresponding block matrix may be measured. Note that the computation time of each instance may be changing because of the activities within each of the matrices, for example each instance may have different model evaluation time, load model time, and solve model time. In addition, based on the changes of the simulation environment, certain processing steps may be bypassed for some parts of the matrix. As a result, computation time of the matrices (processing tasks) may change over time. Simulation efficiency may be improved by balancing the load of processing or computation dynamically.

For example, if a task takes 100 seconds to solve, and the other tasks take 1 or 2 seconds to solve. If there are lots of the smaller 1 or 2 second tasks, it would be more efficient to work on the 100 second task first by one processor, and assigned other smaller tasks to be processed by other processors. If the 100 seconds task were being processed last, other processors would have to wait longer before they can move on to process tasks in the next (higher) level. This method of load balancing is beneficial even when the circuit may be static, i.e. there is no dynamic change of circuit activities. Note that in this example the tasks are order from large (requires longer computation time) to small (requires less computation time). The longest task (or the biggest task) is being worked on first. This approach gives a better chance that other tasks may be finished before the longest task is finished.

As indicated above, the computation time of each task may change dynamically over time. Conditions that may cause changes in computation time include but not limited to: changes of activity levels of the circuit over time and changes of stimuli of circuit activities over time. For example, some portions of a circuit may be latent that do not need model evaluation and/or matrix solving. In some other scenarios, the pattern of circuit activities may change over time, which may cause the corresponding matrices to be harder or easier to solve during simulation, which cause the computation time of the corresponding matrices to change over time. In some implementations, the method performs atomic level timing transactions from the processors to measure the computation time of each node of the circuit under simulation. Then, the method may periodically order the computation/processing tasks. In other implementations, measurement of circuit activities may be performed periodically. In some other implementations, the processors may be configured to measure the time required to perform various simulation tasks according to a predetermined simulation period, such as every ten time steps or every one hundred time steps. Such measurements may be performed atomically or non-atomically.

Figure 5:
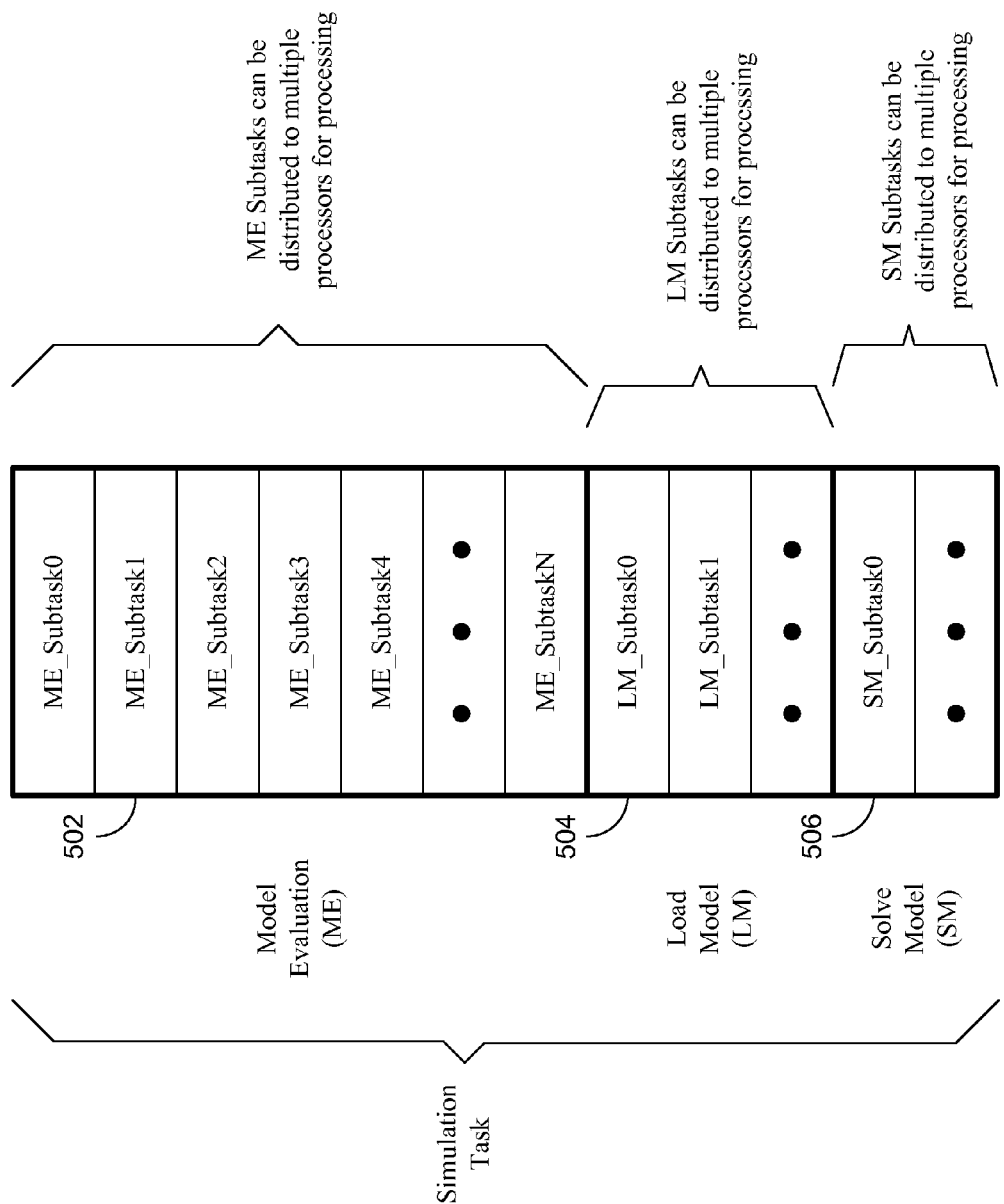
FIG. 5 illustrates another method of performing dynamic load balancing in circuit simulation according to some aspects of the present disclosure.

FIG. 5 illustrates another method of performing dynamic load balancing for circuit simulation according to some aspects of the present disclosure. As shown in FIG. 5, an exemplary simulation procedure may be described in three steps, model evaluation (ME) 502, load matrix (LM) 504, and solve matrix (SM) 506. In this example, it takes the longest time to perform the model evaluation task, then the load model task, and it takes the least amount of time to perform the solve model task.

According to some aspects of the present disclosure, each of the ME, LM, and SM tasks may be further partitioned to their corresponding sub-tasks. For example, the model evaluation task 502 may be further partitioned into ME_Subtask0, ME_Subtask1, ME_Subtask2, ME_Subtask3, ME_Subtask4, ME_SubtaskN, and etc. The load model task 504 may be further partitioned into LM_Subtask0, LM_Subtask1 and etc. The solve matrix task 506 may be further partitioned into SM_Subtask0 and etc. These subtasks may then be distributed to multiple processors to be processed in parallel. Note that the partitioning may be guided using the measured subtask time, and the matrix may be repartitioned based on the subtasks to improve load balancing during simulation. In the example shown in FIG. 5, after having partitioned the ME, LM and SM tasks into their corresponding subtasks, if one processor is partially through processing some of the subtasks of ME 502, another processor may take one or more of the remaining subtasks for processing.

Note that the above technique of subtask distribution and sharing among multiple processors may apply to the processing of load matrix and solve matrix tasks as well. For example, to perform a load matrix task, one approach is to go through the model evaluation outputs and load each value into the matrix one by one. This approach may encounter conflicts in accessing the computer memory, which can incur a large overhead in order to avoid writing the same memory location. An alternative approach is to go through each of the matrix location, read the corresponding outputs of model evaluation that may contribute to the value of the matrix location, and add the value of each output of model evaluation obtained to the matrix location.

According to aspects of the present disclosure, simulation tasks such as ME, LM, SM may be considered as major tasks and such major tasks may be further divided into multiple subtasks, as shown in FIG. 5. One approach to distribute and share the processing of major tasks is to periodically measure the time required to perform the major tasks and then balance the processing load accordingly.

Another way to distribute and share the processing of major tasks is when one of the processors is idle. If there are major tasks waiting to be processed, such major tasks may be permanently taken for processing. Note that, "taking" a major task means the processor that takes the major task into its processing queue would be responsible for processing the major task being taken until that major task may be taken by another processor. According to aspects of the present disclosure, major tasks may be taken permanently; while subtasks may be taken (distributed and shared for processing) temporarily, which means the ownership of the subtasks still belongs to the processor of the major task which the subtask is associated with. In the way, the order of the processing and the relationship among the different subtasks may be maintained.

Figure 6:
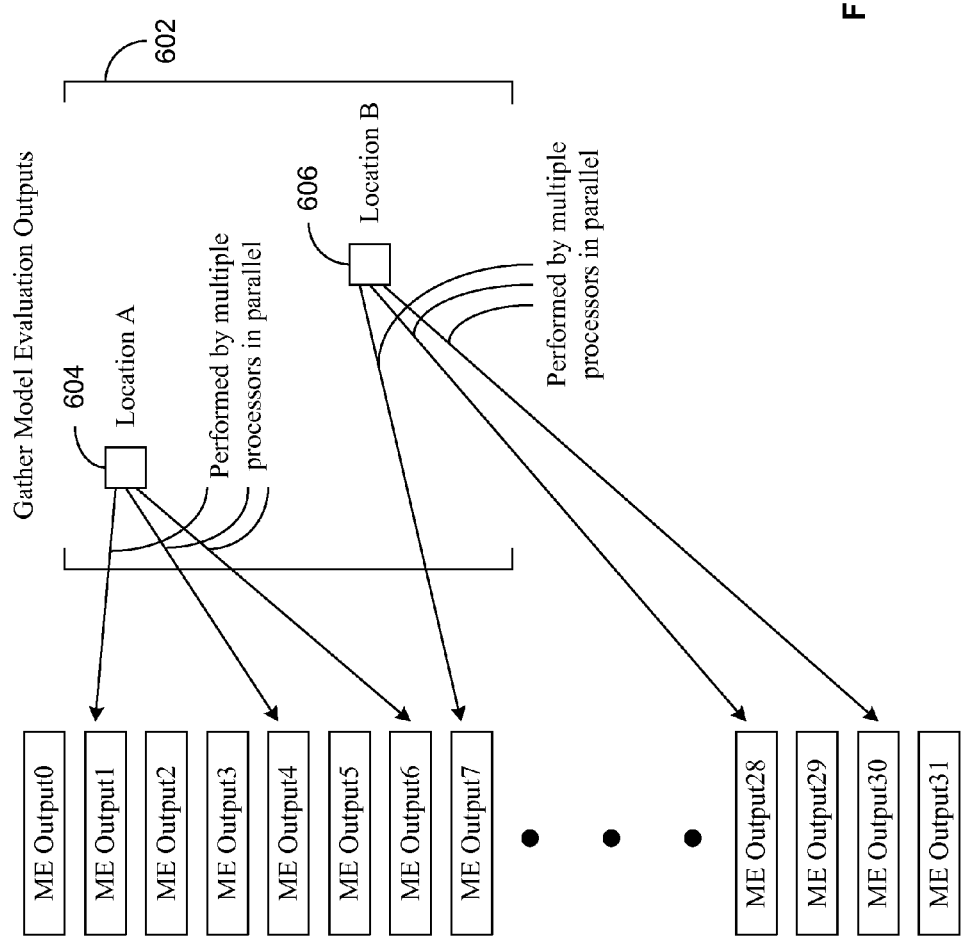
FIG. 6 illustrates yet another method of performing circuit simulation according to some aspects of the present disclosure.

FIG. 6 illustrates yet another method of performing circuit simulation according to some aspects of the present disclosure. As shown in FIG. 6, the method gathers model evaluation outputs for location A 604 and for location B 606 of matrix 602. In this example, Location A 604 may need data from ME Output 1, ME Output 4 and ME Output 6. These three gathering operations may be performed by multiple processors in parallel. Similarly, Location B 606 may need data from ME Output 7, ME Output 28 and ME Output 30. These three gathering operations may be performed by multiple processors in parallel. Note that when a processor gets to a location that has not been completed, the processor would have to wait until the data becomes available for gathering. One approach to communicate between the processors is to provide a flag that may be configured to indicate whether certain task, for example ME Output 7, has been completed. After ME Output 7 has been completed, the gathering for Location B may proceed. This approach takes advantage that the gathering operations may be performed in any order as long as the data from the corresponding model evaluation output becomes available for gathering. Note that load matrix tasks from different hierarchical level of the circuit may be partitioned and performed by multiple processors in parallel. In that case, a lower level matrix may be loaded to a higher level matrix.

According to some aspects of the present disclosure, the tasks of simulating a circuit can be distributed and shared among a set of CPUs and a set of GPUs. Each simulation task may include, but not limited to, model evaluation, matrix solving, checking convergence, and predicting next time step. The GPUs may be more efficient in performing model evaluations and the CPUs may be more efficient in performing matrix solving, checking simulation convergence, and predicting next time step. Therefore, each simulation task may be divided into two phases: a phase the CPUs can handle efficiently and a phase the GPUs can handle efficiently. In handling simulation tasks at each time step, the system can be configured to move back and forth between a task queue and a model evaluation queue in order to manage the distribution of the simulation tasks and perform load balancing to ensure optimal system performance.

Note that to be efficient, it is preferable to configure the GPUs to perform a large quantity of tasks. The system works well for simulating large circuits with millions of devices. For simulation of smaller circuits, to increase the efficiency of the GPUs, a number of model evaluation tasks may be grouped prior to being processed by the GPUs. For example, multiple model evaluations tasks may be grouped together for processing. For some simulation applications, many instances of a smaller circuit may be created, which may involve tens of thousands of separate simulations. GPUs can be used to increase the efficiency of such simulation because the GPUs may be configured to handle a large quantity of model evaluations in parallel. In this way, enough tasks may be gathered to keep the GPUs occupied and thus improving efficiency of the simulation.

According to embodiments of the present disclosure, the system can be configured to perform load balancing between tasks contained in the model evaluation queue and tasks contained in the task queue. In situations when operations of the GPUs are slower than operations of the CPUs, the CPUs and the corresponding CPU worker threads can be configured to take one or more tasks from the model evaluation queue while waiting for the GPUs. In this way, the CPUs are kept busy and the system offloads some of the loadings of the GPUs to the CPUs. Similarly, in situations when operations of the CPUs are slower than operations of the GPUs, the GPUs and the corresponding GPU helper threads can be configured to take one or more tasks from the task queue while waiting for the CPUs. In this way, the GPUs are kept busy and the system offloads some of the loadings of the CPUs to the GPUs.

Figure 7:
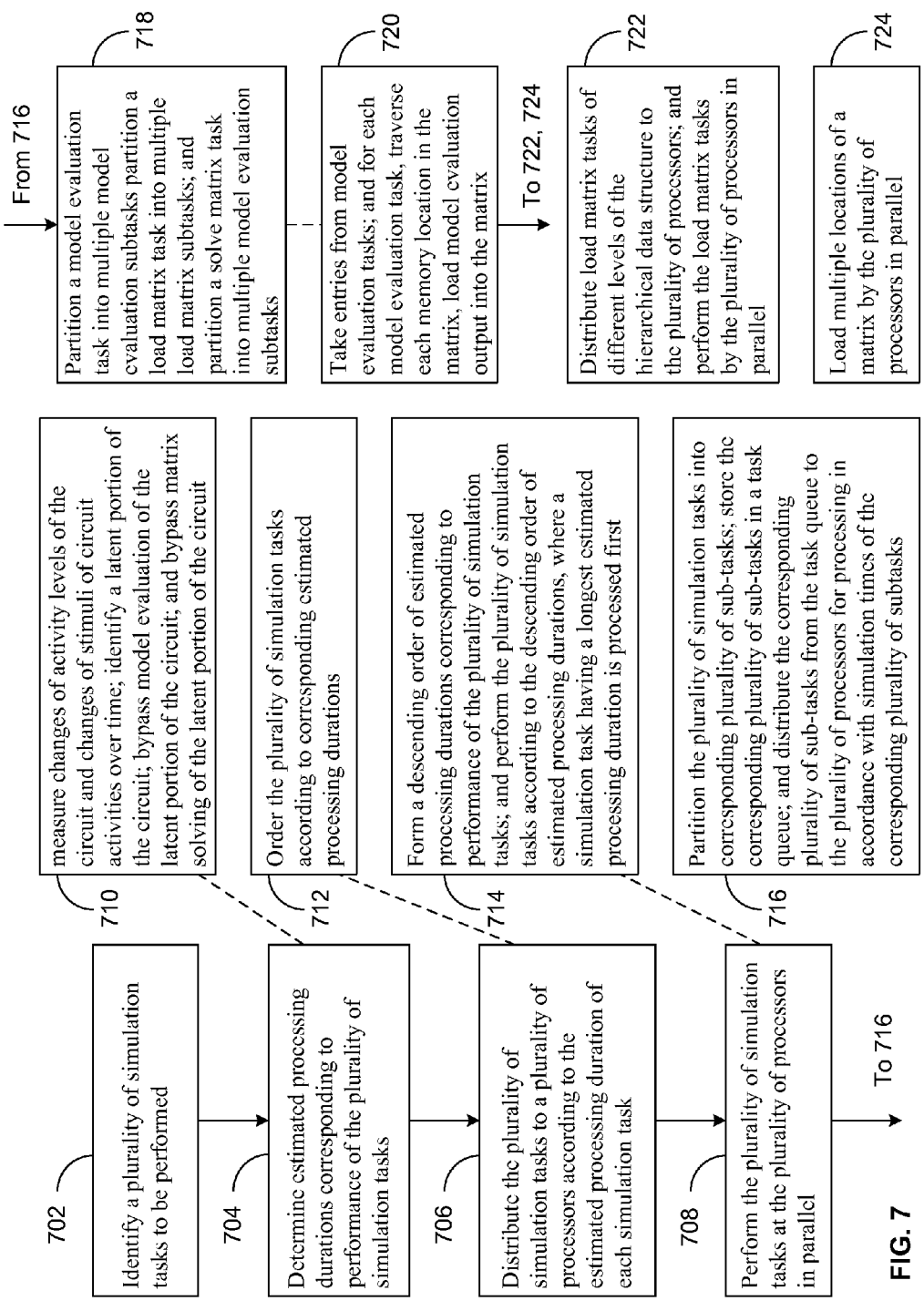
FIG. 7 illustrates an exemplary flow chart of performing dynamic load balancing in circuit simulation according to some aspects of the present disclosure.

FIG. 7 illustrates an exemplary flow chart of performing dynamic load balancing in circuit simulation according to some aspects of the present disclosure. In block 702, the simulator can be configured to identify a plurality of simulation tasks to be performed. In block 704, the simulator can be configured to determine estimated processing durations corresponding to performance of the plurality of simulation tasks. In block 706, the simulator can be configured to distribute the plurality of simulation tasks to a plurality of processors according to the estimated processing duration of each simulation task. In block 708, the simulator can be configured to perform the plurality of simulation tasks at the plurality of processors in parallel. The plurality of simulation tasks comprises Model Evaluation tasks, Load Matrix tasks, and Solve Matrix tasks.

According to embodiments of the present disclosure, the logic implemented in block 704 may further include logic described in block 710. For example, in block 710, the simulator can include logic configured to measure changes of activity levels of the circuit over time, measure changes of stimuli of circuit activities over time, identify a latent portion of the circuit, bypass model evaluation of the latent portion of the circuit, and bypass matrix solving of the latent portion of the circuit. The logic implemented in block 706 may further include logic described in block 712. In block 712, the simulator can include logic configured to order the plurality of simulation tasks according to corresponding estimated processing durations.

According to embodiments of the present disclosure, the logic implemented in block 708 may further include logic described in block 714. In block 714, the simulator can include logic configured to form a descending order of estimated processing durations corresponding to performance of the plurality of simulation tasks, and perform the plurality of simulation tasks according to the descending order of estimated processing durations, where a simulation task having a longest estimated processing duration is processed first.

According to embodiments of the present disclosure, the simulator may further include logic configured to partition the plurality of simulation tasks into corresponding plurality of sub-tasks, to store the corresponding plurality of sub-tasks in a task queue, and to distribute the corresponding plurality of sub-tasks from the task queue to the plurality of processors for processing in accordance with simulation times of the corresponding plurality of subtasks as shown in block 716.

According to embodiments of the present disclosure, the logic implemented in block 716 may further include logic described in block 718. In block 718, the simulator can include logic configured to partition a model evaluation task into multiple model evaluation subtasks, to partition a load matrix task into multiple load matrix subtasks, and to partition a solve matrix task into multiple model evaluation subtasks.

According to embodiments of the present disclosure, the logic implemented in block 718 may further include logic described in block 720. In block 720, the simulator can include logic configured to take entries from model evaluation tasks, and for each model evaluation task, logic configured to traverse each memory location in the matrix and logic configured to load model evaluation output into the matrix.

According to embodiments of the present disclosure, the logic implemented in block 720 may further include logic described in blocks 722 and 724. In block 722, the simulator can include logic configured to distribute load matrix tasks of different levels of the hierarchical data structure to the plurality of processors and to perform the load matrix tasks by the plurality of processors in parallel. In block 724, the simulator can include logic configured to load multiple locations of a matrix by the plurality of processors in parallel.

According to embodiments of the present disclosure, a computer program product comprises a non-transitory medium storing computer programs for execution by one or more computer systems. The computer program product comprises logic configured to identify a plurality of simulation tasks to be performed, logic configured to determine estimated processing durations corresponding to performance of the plurality of simulation tasks, logic configured to distribute the plurality of simulation tasks to a plurality of processors according to the estimated processing duration of each simulation task, and logic configured to perform the plurality of simulation tasks at the plurality of processors in parallel.

The plurality of simulation tasks comprises model evaluation tasks; load matrix tasks; and solve matrix tasks. The code configured to determine estimated processing durations comprises code configured to measure changes of activity levels of the circuit over time, code configured to measure changes of stimuli of circuit activities over time, code configured to identify a latent portion of the circuit, code configured to bypass model evaluation of the latent portion of the circuit, and code configured to bypass matrix solving of the latent portion of the circuit.

The code configured to distribute the plurality of simulation tasks comprises code configured to order the plurality of simulation tasks according to corresponding estimated processing durations. The code configured to perform the plurality of simulation tasks comprises code configured to form a descending order of estimated processing durations corresponding to performance of the plurality of simulation tasks, and code configured to perform the plurality of simulation tasks according to the descending order of estimated processing durations, wherein a simulation task having a longest estimated processing duration is processed first.

The computer program product further comprises code configured to partition the plurality of simulation tasks into corresponding plurality of sub-tasks, code configured to store the corresponding plurality of sub-tasks in a task queue, and code configured to distribute the corresponding plurality of sub-tasks from the task queue to the plurality of processors for processing in accordance with simulation times of the corresponding plurality of subtasks.

The code configured to partition the plurality of simulation tasks comprises code configured to partition a model evaluation task into multiple model evaluation subtasks, code configured to partition a load matrix task into multiple load matrix subtasks, and code configured to partition a solve matrix task into multiple model evaluation subtasks.

The code configured to partition a load matrix task into multiple load matrix subtasks comprises code configured to take entries from model evaluation tasks, and for each model evaluation task, code configured to traverse each memory location in the matrix and code configured to load model evaluation output into the matrix.

The code configured to partition a load matrix task into multiple load matrix subtasks further comprises code configured to distribute load matrix tasks of different levels of the hierarchical data structure to the plurality of processors, and code configured to perform the load matrix tasks by the plurality of processors in parallel. The code configured to perform the load matrix tasks comprises code configured to load multiple locations of a matrix by the plurality of processors in parallel.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processors or controllers. Hence, references to specific functional units are to be seen as references to suitable means for providing the described functionality rather than indicative of a strict logical or physical structure or organization.

The invention can be implemented in any suitable form, including hardware, software, firmware, or any combination of these. The invention may optionally be implemented partly as computer software running on one or more data processors and/or digital signal processors. The elements and components of an embodiment of the invention may be physically, functionally, and logically implemented in any suitable way. Indeed, the functionality may be implemented in a single unit, in a plurality of units, or as part of other functional units. As such, the invention may be implemented in a single unit or may be physically and functionally distributed between different units and processors.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as suited to the particular use contemplated.

What is claimed is:

1. A computer implemented method of performing dynamic load balancing in simulating a circuit, comprising:
   identifying a plurality of simulation tasks to be performed;
   determining estimated processing durations corresponding to performance of the plurality of simulation tasks;
   distributing the plurality of simulation tasks to a plurality of processors according to the estimated processing duration of each simulation task, comprising partitioning the plurality of simulation tasks into corresponding plurality of subtasks, storing the corresponding plurality of subtasks in a task queue, and distributing the corresponding plurality of subtasks from the task queue to the plurality of processors for processing in accordance with simulation times of the corresponding plurality of subtasks; and wherein partitioning the plurality of simulation tasks further comprising partitioning a model evaluation task into multiple model evaluation subtasks, partitioning a load matrix task into multiple load matrix subtasks, and partitioning a solve matrix task into multiple solve matrix subtasks; and
   performing the plurality of simulation tasks at the plurality of processors in parallel.

2. The computer implemented method of claim 1, wherein the plurality of simulation tasks comprises:
   model evaluation tasks; load matrix tasks; and solve matrix tasks.

3. The computer implemented method of claim 1, wherein determining estimated processing durations comprises:
   measuring changes of activity levels of the circuit over time;
   measuring changes of stimuli of circuit activities over time;
   identifying a latent portion of the circuit;
   bypassing model evaluation of the latent portion of the circuit; and
   bypassing matrix solving of the latent portion of the circuit.

4. The computer implemented method of claim 1, wherein distributing the plurality of simulation tasks comprises at least one of:
   ordering the plurality of simulation tasks according to corresponding estimated processing durations; and
   ordering the plurality of simulation tasks according to corresponding measured processing durations.

5. The computer implemented method of claim 1, wherein performing the plurality of simulation tasks comprises:
   forming a descending order of estimated processing durations corresponding to performance of the plurality of simulation tasks; and
   performing the plurality of simulation tasks according to the descending order of estimated processing durations, wherein a simulation task having a longest estimated processing duration is processed first.

6. The computer implemented method of claim 1, wherein partitioning a load matrix task into multiple load matrix subtasks comprises:
   taking entries from model evaluation tasks; and
   for each model evaluation task, traversing each memory location in the matrix and loading model evaluation output into the matrix.

7. The computer implemented method of claim 1, wherein partitioning a load matrix task into multiple load matrix subtasks further comprises:
   distributing load matrix tasks of different levels of the hierarchical data structure to the plurality of processors; and
   performing the load matrix tasks by the plurality of processors in parallel.

8. The computer implemented method of claim 7, wherein performing the load matrix tasks comprises:
   loading multiple locations of a matrix by the plurality of processors in parallel.

9. An apparatus for performing dynamic load balancing in simulating a circuit, comprising:
   one or more processors;
   a dynamic load balancing module controlled by the one or more processors; wherein the dynamic load balancing module comprises:
   logic configured to identify a plurality of simulation tasks to be performed;
   logic configured to determine estimated processing durations corresponding to performance of the plurality of simulation tasks;
   logic configured to distribute the plurality of simulation tasks to a plurality of processors according to the estimated processing duration of each simulation task, comprising logic configured to partition the plurality of simulation tasks into corresponding plurality of subtasks, logic configured to store the corresponding plurality of subtasks in a task queue, and logic configured to distribute the corresponding plurality of subtasks from the task queue to the plurality of processors for processing in accordance with simulation times of the corresponding plurality of subtasks; and wherein the logic configured to partition the plurality of simulation tasks further comprises logic configured to partition a model evaluation task into multiple model evaluation subtasks, logic configured to partition a load matrix task into multiple load matrix subtasks, and logic configured to partition a solve matrix task into multiple solve matrix subtasks; and
   logic configured to perform the plurality of simulation tasks at the plurality of processors in parallel.

10. The apparatus of claim 9, wherein the plurality of simulation tasks comprises:
    model evaluation tasks; load matrix tasks; and solve matrix tasks.

11. The apparatus of claim 9, wherein logic configured to determine estimated processing durations comprises:
    logic configured to measure changes of activity levels of the circuit over time;
    logic configured to measure changes of stimuli of circuit activities over time;
    logic configured to identify a latent portion of the circuit;
    logic configured to bypass model evaluation of the latent portion of the circuit; and
    logic configured to bypass matrix solving of the latent portion of the circuit.

12. The apparatus of claim 9, wherein logic configured to distribute the plurality of simulation tasks comprises:
    logic configured to order the plurality of simulation tasks according to corresponding estimated processing durations; and
    logic configured to order the plurality of simulation tasks according to corresponding measured processing durations.

13. The apparatus of claim 9, wherein logic configured to perform the plurality of simulation tasks comprises:
- logic configured to form a descending order of estimated processing durations corresponding to performance of the plurality of simulation tasks; and
- logic configured to perform the plurality of simulation tasks according to the descending order of estimated processing durations, wherein a simulation task having a longest estimated processing duration is processed first.

14. The apparatus of claim 9, wherein logic configured to partition a load matrix task into multiple load matrix subtasks comprises:
- logic configured to take entries from model evaluation tasks; and
- for each model evaluation task, logic configured to traverse each memory location in the matrix and logic configured to load model evaluation output into the matrix.

15. The apparatus of claim 9, wherein logic configured to partition a load matrix task into multiple load matrix subtasks further comprises:
- logic configured to distribute load matrix tasks of different levels of the hierarchical data structure to the plurality of processors; and
- logic configured to perform the load matrix tasks by the plurality of processors in parallel.

16. The apparatus of claim 15, wherein logic configured to perform the load matrix tasks comprises:
- logic configured to load multiple locations of a matrix by the plurality of processors in parallel.

17. A system for performing dynamic load balancing in simulating a circuit by a machine comprising one or more processors, and a dynamic load balancing module controlled by the one or more processors, comprising:
- means for identifying a plurality of simulation tasks to be performed;
- means for determining estimated processing durations corresponding to performance of the plurality of simulation tasks;
- means for distributing the plurality of simulation tasks to a plurality of processors according to the estimated processing duration of each simulation task, comprising means for partitioning the plurality of simulation tasks into corresponding plurality of subtasks, means for storing the corresponding plurality of subtasks in a task queue, and means for distributing the corresponding plurality of subtasks from the task queue to the plurality of processors for processing in accordance with simulation times of the corresponding plurality of subtasks; and wherein the means for partitioning the plurality of simulation tasks further comprising means for partitioning a model evaluation task into multiple model evaluation subtasks, means for partitioning a load matrix task into multiple load matrix subtasks, and means for partitioning a solve matrix task into multiple solve matrix subtasks; and
- means for performing the plurality of simulation tasks at the plurality of processors in parallel.

\* \* \* \* \*